United States Patent [19]

Ikeguchi et al.

[11] 4,394,778
[45] Jul. 19, 1983

[54] TUNING CONTROL APPARATUS OF RECEIVER

[75] Inventors: Shigehiko Ikeguchi; Kouzi Tanaka, both of Oora, Japan

[73] Assignees: Sanyo Electric Co., Ltd., Moriguchi; Tokyo Sanyo Electric Co. Ltd., Gunma, both of Japan

[21] Appl. No.: 196,272

[22] Filed: Oct. 14, 1980

[30] Foreign Application Priority Data

Oct. 16, 1979 [JP] Japan .................................. 54-133986

[51] Int. Cl.³ .............................................. H04B 1/26
[52] U.S. Cl. ..................................... 455/182; 455/183
[58] Field of Search ............... 455/164, 165, 182, 183, 455/192, 260, 263, 264; 358/191.1, 195.1, 193.1

[56] References Cited

U.S. PATENT DOCUMENTS

| | | | |
|---|---|---|---|
| 3,962,640 | 6/1976 | Bomba | 455/183 |
| 4,023,116 | 5/1977 | Alfke et al. | 455/260 |
| 4,031,549 | 6/1977 | Rast et al. | 455/183 |
| 4,262,364 | 4/1981 | Fujita | 455/264 |

Primary Examiner—Marc E. Bookbinder
Attorney, Agent, or Firm—Darby & Darby

[57] ABSTRACT

The output of a voltage controlled oscillator serving as a local oscillator is frequency divided by a prescaler and a programmable frequency divider, and the frequency divided output is applied to a phase locked loop including a phase comparator and a charge pump. An S curve signal obtained from a frequency discriminator is applied to an automatic frequency control loop including a window comparator and a charge pump. The outputs of these two charge pumps are applied through an analog switch to a common low-pass filter and the output of the low-pass filter is applied to the voltage controlled oscillator as a control voltage. A state of reception by the tuner is detected based on the output of an intermediate frequency amplifier and the analog switch is responsive to the detected output and a lock detected output of the phase locked loop. Accordingly, a control voltage obtained from the phase locked loop on the occasion of a station selecting operation or a control voltage obtained from the automatic frequency control loop on the occasion of the reception of the electric wave by the tuner, is switchably selected and is applied to the voltage controlled oscillator.

9 Claims, 16 Drawing Figures

TUNING CONTROL APPARATUS OF RECEIVER

BACKGROUND OF THE INVENTION

1. Field of the Invention

The present invention relates to a tuning control apparatus of a receiver. More specifically, the present invention relates to a tuning control apparatus in a receiver adapted for electronically controlling a direct current voltage applied to a variable capacitance diode included in a tuner that operates based on a digital numerical value associated with a broadcasting frequency.

2. Description of the Prior Art

A tuning control system of a receiver employing a voltage controlled oscillator serving as a local oscillator in a tuner may be classified into two types, as well known in the art. One is a frequency synthesizer type employing a phase locked loop and the other is a voltage synthesizer type employing digital/analog conversion. A tuning control system employing a frequency synthesizer is disclosed in, for example, U.S. Pat. No. 4,081,752, issued Mar. 28, 1978 to Yasuaki Sumi. Such a frequency synthesizer type is adapted such that an oscillation output obtained from a crystal controlled oscillator is used as a reference frequency and a tuning voltage is generated responsive to a phase difference between the reference frequency and the local oscillation frequency. Accordingly, the accuracy and stability of the tuning are excellent. However, such a type of tuning is liable to be influenced by a harmonic component generated by a frequency divider included in a phase locked loop, a fluctuation of a phase locked loop, or the like. Therefore, the noise characteristic of the tuner as a whole may be degraded. In the case where a ceramic filter is employed in an intermediate frequency stage, another disadvantage is encountered in that the tuning accuracy is influenced by the diversity of the characteristic of such a ceramic filter.

On the other hand, a voltage synthesizer type is disclosed in, for example, U.S. Pat. No. 3,968,440, issued July 6, 1976 to George John Ehni, III. Since a tuning control system employing such a voltage synthesizer utilizes a direct current voltage obtained from a digital-/analog converter as a tuning voltage, an advantage is brought about in that a high signal-to-noise ratio can be attained using a conventional tuner design technology. Nevertheless, a tuning control system of the voltage synthesizer type involves a problem in conjunction with tuning accuracy and stability.

SUMMARY OF THE INVENTION

Briefly described, the present invention comprises a novel tuning control apparatus adapted such that a tuning control voltage is provided using a phase locked loop until receipt of a desired broadcasting wave by a receiver, i.e. on the occasion of a station selecting operation, and after a broadcasting wave is once received, such control voltage is provided using an automatic frequency control loop.

According to the present invention, a phase lock loop is operable during tuning and an automatic frequency control loop is operable, according to an S curve signal, when the receiver has received a broadcasting wave. In such a receiving state the receiver is immune to any influence due to fluctuation of the phase locked loop. Accordingly, the signal-to-noise ratio can be improved, while the above-described advantage of a frequency synthesizer type receiver, i.e. the high tuning accuracy, is maintained. Furthermore, after a broadcasting wave is received and the system switches to the automatic frequency control loop which is operable according an S curve signal, erroneous tuning such as tuning to an adjacent channel, is eliminated, with the result that station selection is more assured. Furthermore, even if a ceramic filter is utilized in an intermediate frequency stage, any influence exerted by the diversity of the characteristic of such a ceramic filter is mitigated by the operation of the automatic frequency control loop. Therefore, deviation of the tuning is eliminated by virtue of the circuit's ability to pull-in to the correct tuning point and ceramic filters of more diversified characteristic may be utilized.

In a preferred embodiment of the present invention, in switching from the phase locked loop to the automatic frequency control loop upon receipt of a broadcasting wave, the operation of a frequency divider included in the phase locked loop is disabled. Therefore, the embodiment described is immune to influence from a harmonic component of the frequency divider, with the result that a more improved signal-to-noise ratio can be attained.

According to another preferred embodiment of the present invention, the switching from the phase locked loop to the automatic frequency control loop is made responsive not only to reception of a broadcasting wave but also the detection of the phase locked loop having reached a stabilized state, i.e. a locked state, and therefore tuning accuracy and stability are excellent.

Accordingly, a principal object of the present invention is to provide a novel tuning controlled apparatus of a receiver, in which a signal-to-noise ratio as well as tuning accuracy and stability are increased.

Another object of the present invention is to provide a tuning control apparatus of a receiver in which a selection is made between a phase locked loop and an automatic frequency control loop that is operable according to an S curve signal, depending on whether the receiver is performing a station selecting operation or is receiving a desired broadcasting wave.

A further object of the present invention is to provide a tuning control apparatus of a receiver, wherein immunity to the diversity of the characteristic of a ceramic filter is attained while still using a ceramic filter.

Still another object of the present invention is to provide a tuning control apparatus of a receiver which is immune to the influence of a high frequency component caused by a frequency divider included in a phase locked loop, whereby an increased signal-to-noise ratio can be attained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
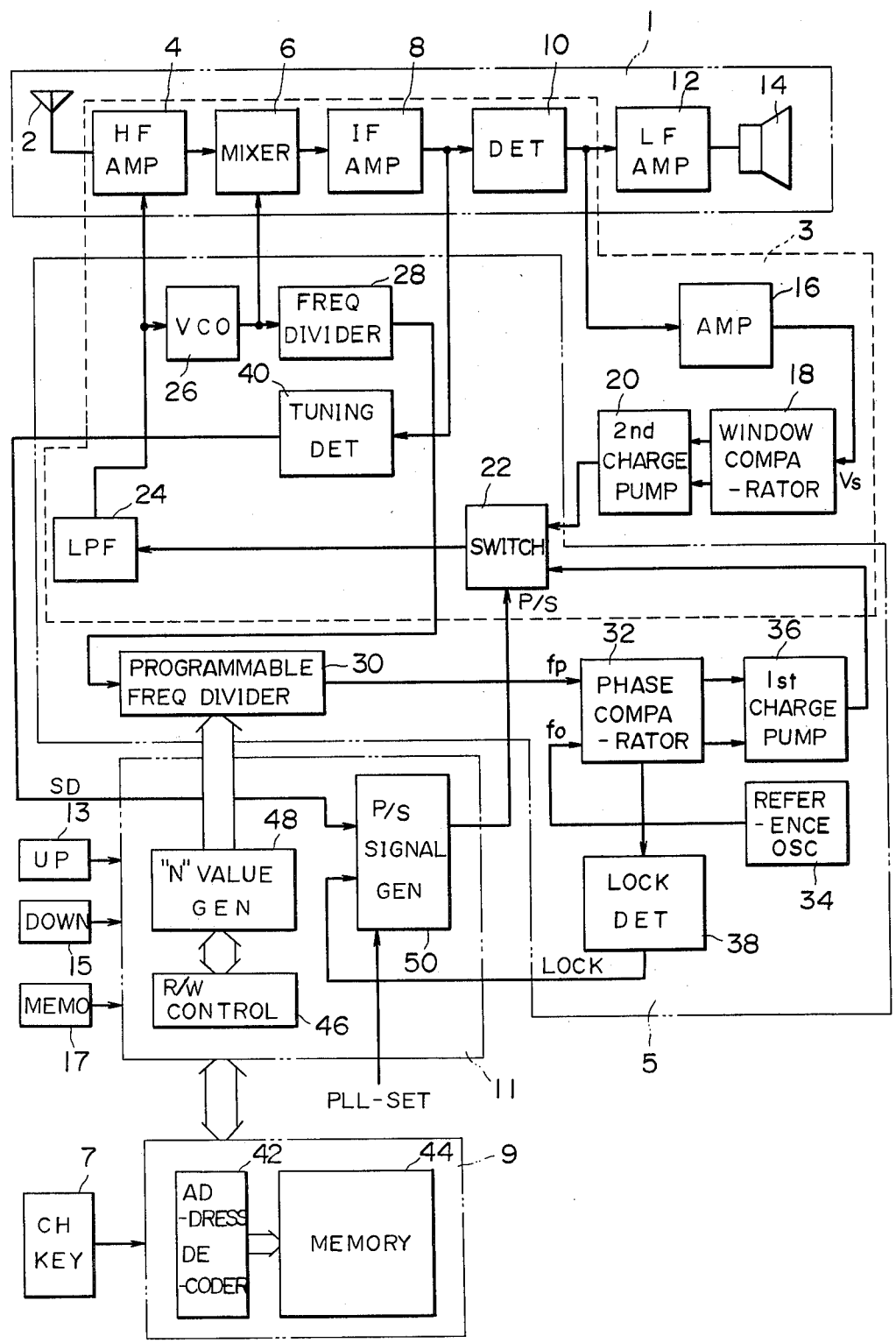
FIG. 1 is a block diagram showing one embodiment of the present invention.

FIG. 1 is block diagram showing one embodiment of the present invention. The embodiment shown is an example of an FM radio receiver. The FM receiver 1 comprises an antenna 2. A high frequency signal received by the antenna 2 is amplified by a high frequency amplifier 4. The output of the high frequency amplifier 4 is applied to a mixer 6. The mixer 6 is also connected to receive a local oscillation signal from a voltage controlled oscillator 26 serving as a local oscillator. As a result, the output of the mixer 6 is an intermediate frequency signal. The intermediate frequency signal obtained from the mixer 6 is amplified by an intermediate frequency amplifier 8 and the amplified intermediate frequency signal is detected by an FM detecting circuit 10 including a frequency discriminator. The output of the detecting circuit 10 is amplified by a low frequency amplifier 12 and the amplified low frequency signal is applied to a speaker 14, thereby to produce a sound.

Referring to FIG. 1, a block 3 encircled with a dotted line shows an automatic frequency control loop operable according to an S curve signal and a block 5 encircled with a dot-dash line shows a phase locked loop. The automatic frequency control loop 3 comprises an amplifier 16 for amplifying an S curve signal obtained from the FM detector 10. The output voltage Vs obtained from the amplifier 16 is applied to a window comparator 18 having two different threshold levels. The two outputs of the window comparator 18 are applied to a second charge pump 20. The second charge pump generates 3-value digital signals associated with the output voltage Vs from the window comparator 18, i.e. a high level for a first state, the low level for the second state and a high impedance for the third state. The window comparator 18 and the second charge pump 20 will be described in more detail subsequently with reference to FIGS. 4 and 5. The output of the second charge pump 20 is applied to a switch circuit 22.

On the other hand, the phase locked loop 5 comprises a frequency divider 28 connected to receive the output from the local oscillator, i.e. the voltage controlled oscillator 26. The frequency divider 28 is referred to as a prescaler and is adapted to frequency divide the local oscillation signal at a fixed frequency division ratio, said 1/10. The output of the frequency divider 28 is applied to a programmable frequency divider 30. The programmable frequency divider 30 is supplied with the frequency division ratio data from an "N" value generator 48 included in a control circuit 11, to be described subsequently, thereby to frequency divide the signal obtained from the fixed frequency divider 28 in accordance with the above described frequency division ratio data. The output of the programmable frequency divider 30 is applied to a phase comparator 32 as a frequency signal fp. The phase comparator 32 is connected to receive, as a reference frequency signal fo, the output from a reference oscillator 34, such as a crystal controlled oscillator. The phase comparator 32 compares the phases of these two signals fp and fo, thereby to provide a signal associated with the phase difference to a first charge pump 36. Accordingly, the first charge pump 36 provides 3-value digital signals, i.e. a high level for the first state, a low level for the second state and a high impedance for the third state. The phase comparator 32 and the first charge pump 36 will be also described in more detail subsequently with reference to FIGS. 2 and 3. The output of the first charge pump 36 is applied to the switch circuit 22.

The switch circuit 22 is responsive to the signal P/S obtained from a P/S signal generator 50 included in the control circuit 11 to be described subsequently, thereby to select the digital signal from the first charge pump 36 or the digital signal from the second charge pump 20 and to provide the same to a low-pass filter 24. Although the signal P/S will be described in more detail subsequently, the same is provided as a two-value signal, so that the switch circuit 22 is switched from applying the digital signal from the first charge pump to the low-pass filter 24 to applying the signal from the second charge pump on the occasion of the reception of a broadcasting wave by the receiver 1. The low-pass filter 24 provides a direct current voltage responsive to the digital signal obtained from the first charge pump 36 or the second charge pump 20 through the switch circuit 22 and the above described direct current voltage is applied as a tuning voltage or a control voltage to the high frequency amplifier 4 and the voltage controlled oscillator 26.

The phase comparator 32 (or the first charge pump 36) included in the phase locked loop 5 is connected to a lock detecting circuit 38, so that the lock detecting circuit 38 may detect whether the phase locked loop 5 is locked. The lock detecting circuit 38 may be of the type disclosed in U.S. Pat. No. 4,201,945, issued May 6, 1980 to Ohgishi et al. and assigned to the same assignee as the present invention. Basically, the lock detecting circuit 38 is adapted to provide a lock detected output signal, LOCK, responsive to the absence of a phase difference between the two signals fp and fo.

A channel key 7 is provided for selection of a station by the FM receiver 1. The channel key 7 comprises a plurality of keys for selecting a plurality of channels and the operation signal produced by the keys is applied to a memory circuit 9. The memory circuit 9 comprises an address decoder 42 and a memory 44. The memory 44 is implemented by a programmable read only memory, for example, so that frequency division ratio data may be stored for the respective channels. Besides the channel key 7, an upward key 13, a downward key 15 and a memory key 17 are provided. The operation signals of these three keys 13, 15 and 17 are applied to the control circuit 11. The control circuit 11 comprises a read-/write controller 46 and an "N" value generator 48. The "N" value generator 48 comprises a presettable up-/down counter, for example. Upon operation of the memory key 17, the read/write controller 46 is placed in a writing mode. Accordingly, the "N" value obtained from the "N" value generator 48 is stored in the address of the memory 44 designated by the channel key 7 and thus by the address decoder 48. When the channel key 7 is operated to select the station of a desired channel, the corresponding address of the memory 44 is designated by the address decoder 42 and the frequency division ratio data is read out from the address and the same is preset in the "N" value generator 48 through the read/write controller 48. As a result, the frequency division ratio data obtained from the memory 44 is set in the programmable frequency divider 30. Meanwhile, alternatively the "N" value from the "N" value generator 48 may be renewed (incremented or decremented) and set in the programmable frequency divider 30 through operation of the upward key 13 or the downward key 15 rather than utilizing the channel key 7.

The control circuit 11 further comprises P/S signal generator 50. As will be described in more detail subsequently with reference to FIG. 7, the P/S signal generator 50 is responsive to the signal SD from the tuning detecting circuit 40, the signal LOCk from the lock detecting circuit 38, and a signal PLL-SET, to be described subsequently, to change the state of the signal P/S. Meanwhile, a circuit for generating the signal PLL-SET will be described in more detail subsequently with reference to FIG. 8.

Figure 2:
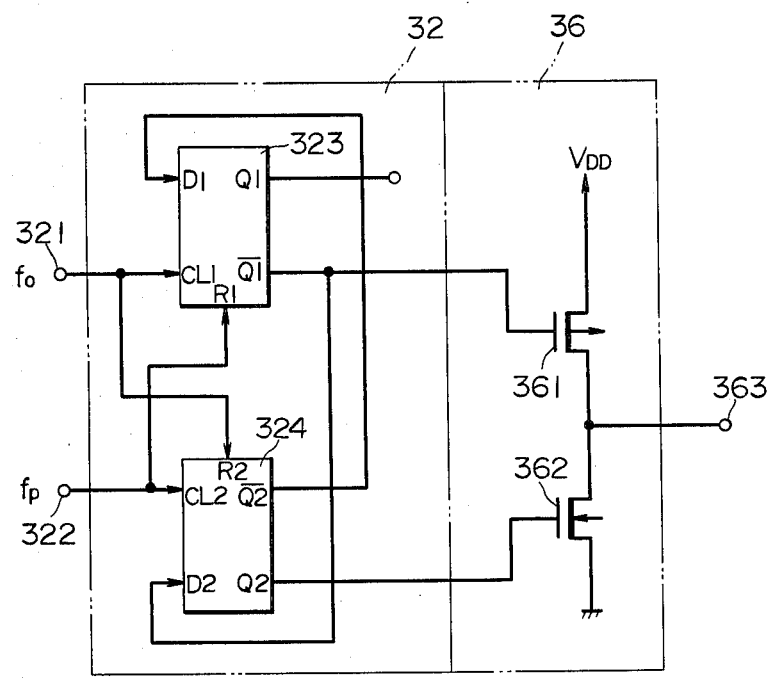
FIG. 2 is a schematic diagram showing, partially in a block form, a preferred embodiment of a phase comparator and a charge pump included in a phase locked loop.

Now referring to FIGS. 2 and 3, the phase comparator 32 and the first charge pump 36 included in the phase locked loop 5 will be described in more detail. The phase comparator 32 has two input terminals 321 and 322, which are connected to receive the reference frequency signal fo from the reference oscillator 34 and the frequency signal fp from the programmable frequency divider 30, respectively. The phase comparator 32 comprises two delay flip-flops 323 and 324, which have clock terminals CL1 and CL2, reset terminals R1 and R2, data terminals D1 and D2, and output terminals Q1, $\overline{Q1}$ and $\overline{Q2}$, Q2, respectively. The reference frequency signal fo is applied to the clock terminal CL1 of the delay flip-flop 323 and is also applied to the reset terminal R2 of the delay flip-flop 324. The frequency signal fp, the phase of which is to be compared, is applied to the clock terminal CL2 of the delay flip-flop 324 and is also applied to the reset terminal R1 of the delay flip-flop 323. The output terminal $\overline{Q1}$ is connected to the data terminal D2 and the output terminal $\overline{Q2}$ is connected to the data terminal D1. The output terminal $\overline{Q1}$ of the delay flip-flop 323 is connected to the gate electrode of a P channel field effect transistor 361 constituting the charge pump 36. On the other hand, the output terminal Q2 of the delay flip-flop 324 is connected to the gate electrode of an N channel field effect transistor 362 included in the charge pump 36. The charge pump 36 comprises a series connection of the above described two field effect transistors 361 and 362. One end of the above described series connection is connected to the ground level and the other end of the above described series connection is connected to the positive source voltage $V_{DD}$. The junction of the field effect transistors 361 and 362 is connected to the output terminal 363 of the charge pump 36.

Meanwhile, the delay flip-flops 323 and 324 used in the embodiment shown will operate in the following manner. More specifically, these delay flip-flops are operable responsive to the rise of the clock applied to the clock terminals CL and make no change of the output Q responsive to the fall of the clock signal. On the occasion of the rise of the clock, if the signal at the data terminal D is the logic one, the output Q becomes the logic one, and conversely on the occasion of the rise of the clock, if the signal at the data terminal D is the logic zero, the output Q becomes the logic zero. Based on the above described understanding of the operation of these delay flip-flops, now the operation of the FIG. 2 embodiment will be described with reference to FIG. 3.

Figure 3:
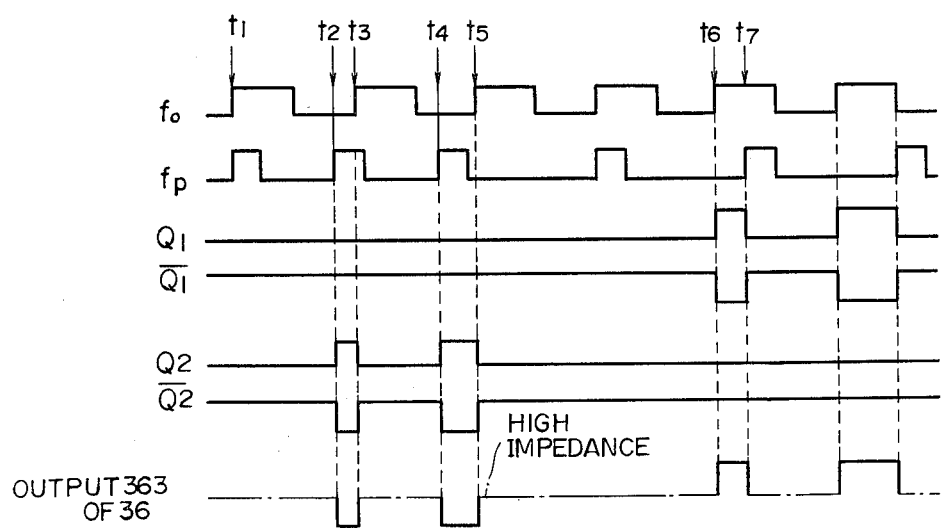
FIG. 3 is a graph showing waveforms for explaining the operation of the FIG. 2 embodiment.

Let it be assumed that the signals fo and fp are applied as shown as "fo" and "fp" in FIG. 3. Further let it be assumed that at the time t1 in FIG. 3, the signals fo and fp are in phase. Accordingly, both the delay flip-flops 323 and 324 are reset. Therefore, the outputs Q1 and Q2 both become the logic zero and conversely the outputs $\overline{Q1}$ and $\overline{Q2}$ both become the logic one. Therefore, the P channel field effect transistor 361 included in the charge pump 36 is rendered non-conductive and the N channel field effect transistor 362 included in the charge pump 36 is also rendered non-conductive. Accordingly, the output terminal 363 of the charge pump 36 exhibits a high impedance state.

If and when the phase of the signal fp progresses as at time t2 in FIG. 3, the output Q2 of the delay flip-flop 324 changes to the logic one state. Since at that time the clock terminal CL1 of the delay flip-flop 323 has not been supplied with the rise of the input signal fo, the output terminal $\overline{Q1}$ of the flip-flop 323 remains in the logic zero state and the output terminal Q1 of the flip-flop 323 remains in the logic state one. Accordingly, in such a state the N channel field effect transistor 362 included in the charge pump 36 is rendered conductive, while the P channel field effect transistor 361 of the charge pump 36 remains in a non-conductive state. Therefore, the output terminal 363 of the charge pump 36 changes to a low level state. Even if the signal fo rises thereafter, as at the time t3, the delay flip-flop 323 does not make any change in state, since the same has been reset responsive to the previous signal fp. Furthermore, the delay flip-flop 324 is reset responsive to the rise of the signal fo and at that time the output terminal Q2 turns to the logic zero. Accordingly, the N channel field effect transistor 362 included in the charge pump 36 returns again to a nonconductive state. More specifically, during a time period when the output Q2 of the delay flipflop 324 is in the logic one state, the output terminal 363 of the charge pump 36 exhibits the low level state.

When the input signal fp rises again at the time t4 in FIG. 3, the output terminal Q2 of the delay flip-flop 324 changes to the logic one state again. When the input signal fo rises, as at time t5, after the input signal fp rises, the delay flip-flop 324 is reset and the output terminal Q2 changes to the logic zero state. Although the clock terminal CL1 of the delay flip-flop 323 is supplied with the rise of the signal fo, the delay flip-flop 323 has been supplied, at the data terminal D1, with the logic zero of the output terminal $\overline{Q2}$ before the delay flip-flop 324 is reset and therefore the output terminal Q1 remains in the logic zero state. Thus, during a time period when the output terminal Q2 of the delay flip-flop 324 is in the logic one state, the N channel field effect transistor 362 included in the charge pump 36 is placed in a conductive state and the output terminal 363 changes to the low level.

Now consider a case where the signal fo has advanced in terms of the phase as compared with the input signal fp as at time t6 in FIG. 3. Since the delay flip-flop 323 has been supplied, at the data terminal D1, with the logic one of the output $\overline{Q2}$ of the delay flip-flop 324, the output terminal Q1 changes to the logic one state at time t6 and the output terminal $\overline{Q1}$ changes to the logic zero state. Accordingly, the P channel field effect transistor 361 included in the charge pump 36 is placed in a conductive state. On the other hand, the output terminal Q2 of the flip-flop 324 remains in the logic zero state and the N channel field effect transistor 362 included in the charge pump 36 remains in a non-conductive state. When the signal fp rises at time t7, the delay flip-flop 323 is reset and accordingly the output $\overline{Q1}$ changes to the logic one state. Therefore, the P channel field effect transistor 361 returns to a non-conductive state. More specifically, during a time period when the output terminal $\overline{Q1}$ of the delay flip-flop 323 is at logic zero, the P channel field effect transistor 361 included in the charge pump 36 is rendered conductive and the output terminal 363 exhibits the high level state.

Thus, it should be appreciated that the 3-value digital signals are obtained from the output terminal 363 of the charge pump 36 responsive to the phase difference between the input signals fo and fp.

Figure 4:
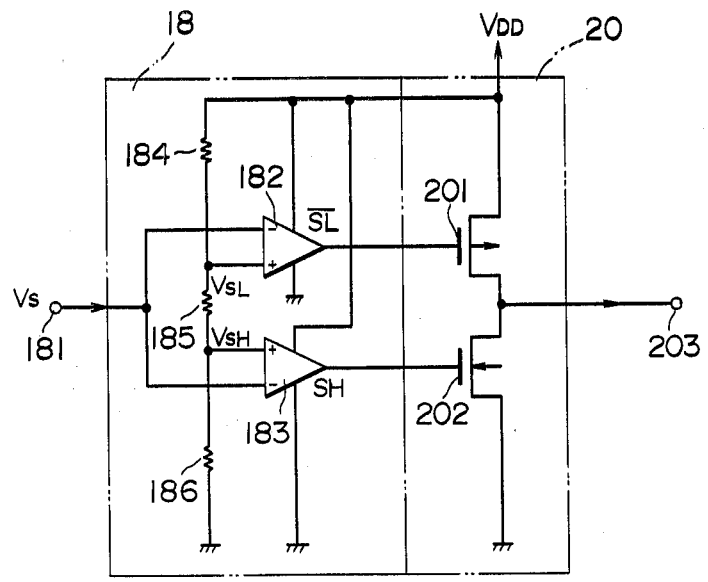
FIG. 4 is a schematic diagram showing a preferred embodiment of a window comparator and a charge pump included in an automatic frequency control loop operable according to an S curve signal.

Now referring to FIGS. 4 and 5, the operation of the window comparator 18 and the second charge pump 20 included in the automatic frequency control loop 3 will be described in detail. The S curve signal from the frequency discriminator included in the FM detecting circuit 10 is amplified by the amplifier 16 and is applied, as the voltage Vs, to the input 181 of the window comparator 18. The window comparator 18 comprises two operational amplifiers 182 and 183, with the S curve signal voltage Vs is applied to one input (−) of each of the operational amplifiers 182 and 183. The window comparator 18 comprises a voltage dividing circuit including a series connection of three resistors 184, 185 and 186, and the voltages at each end of the resistor 185, i.e. the voltages $Vs_L$ and $Vs_H$, are applied to the other input (+) of each of the operational amplifiers 182 and 183, respectively. The second charge pump 20 may be structured in the same manner as the previously described first charge pump 36 and comprises a series connection of a P channel field effect transistor 201 and an N channel field effect transistor 202, the junction of which is connected to the output terminal 203. Meanwhile, the terminal voltages $Vs_L$ and $Vs_H$ of the resistor 185 are the threshold value levels of the window comparator 18 and are selected such that $Vs_L > Vs_H$. The output of the operational amplifier 182 is applied, as the signal SL, to the gate electrode of the P channel field effect transistor 201 and the output of the operational amplifier 183 is applied, as the signal SH, to the gate electrode of the N channel field effect transistor 202.

Figure 5:
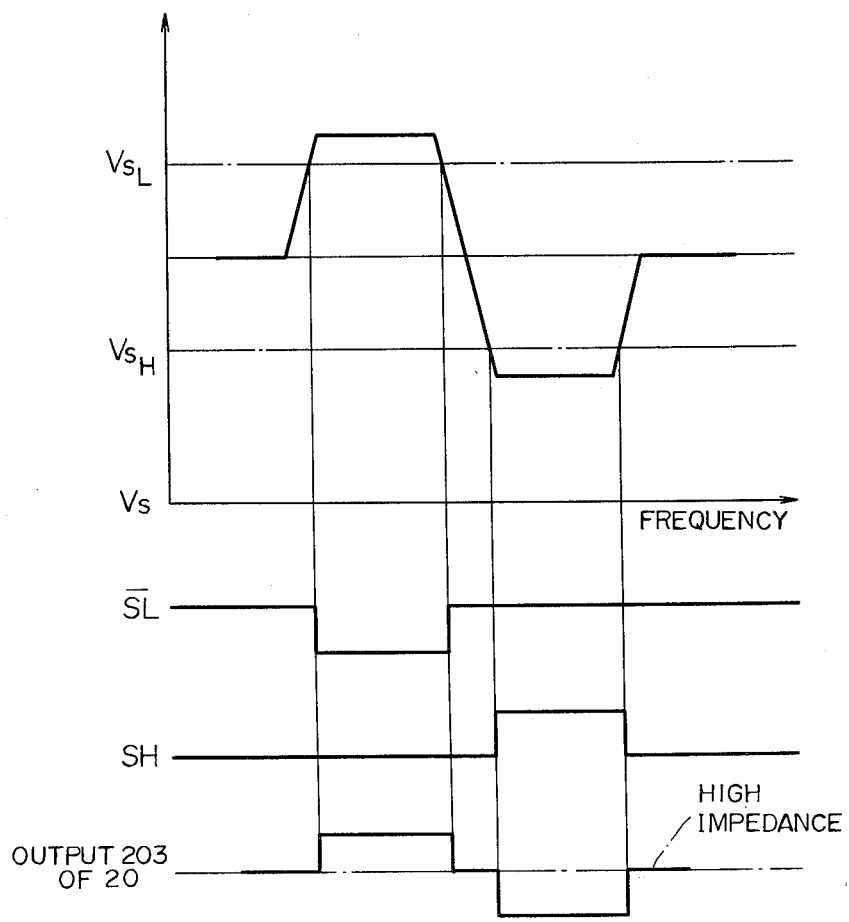
FIG. 5 is a graph showing waveforms for explaining the operation of the FIG. 4 embodiment.

Now consider a case where the S curve signal as shown in FIG. 5 is applied as the voltage signal Vs. Let it be assumed that the two threshold values $Vs_L$ and $Vs_H$ have been set as shown in FIG. 5. Further consider a case where the voltage signal Vs is higher than the threshold value $Vs_L$, i.e. the tuning frequency has deviated lower than the correct tuning point. In such a case, the output signals $\overline{SL}$ and SH of the operational amplifiers 182 and 183 both are at the low level. Accordingly, the P channel field effect transistor 201 included in the charge pump 21 is rendered conductive and the N channel field effect transistor 202 included in the charge pump 20 is rendered non-conductive. Accordingly, the output terminal 203 of the charge pump 20 exhibits the high level state as shown in FIG. 5.

In the case where the voltage signal Vs is between the two threshold values $Vs_L$ and $Vs_H$, i.e. the tuning frequency is at the correct tuning point, then the output signal $\overline{SL}$ of the operational amplifier 182 becomes the high level but the output SH of the operational amplifier 183 becomes the low level. Accordingly, the P channel field effect transistor 201 and the N channel field effect transistor 202 included in the charge pump 20 both are rendered non-conductive. Therefore, the output terminal 203 of the charge pump 24 exhibits the high impedance state.

In the case where the voltage signal Vs is lower than the threshold value $Vs_H$, i.e. in the case where the tuning frequency has deviated higher than the correct tuning point, the outputs $\overline{SL}$ and SH of the two operational amplifiers 182 and 183 both are the high level. Accordingly, the P channel field effect transistor 201 included in the charge pump 20 is rendered nonconductive and the N channel field effect transistor 202 included in the charge pump 20 is rendered conductive. Therefore, the output terminal 203 of the charge pump 20 exhibits the low level state in such situation.

Thus, it can be appreciated that the charge pump 20 generates the 3-value digital signals in association with the S curve signal voltage Vs.

Figure 6:
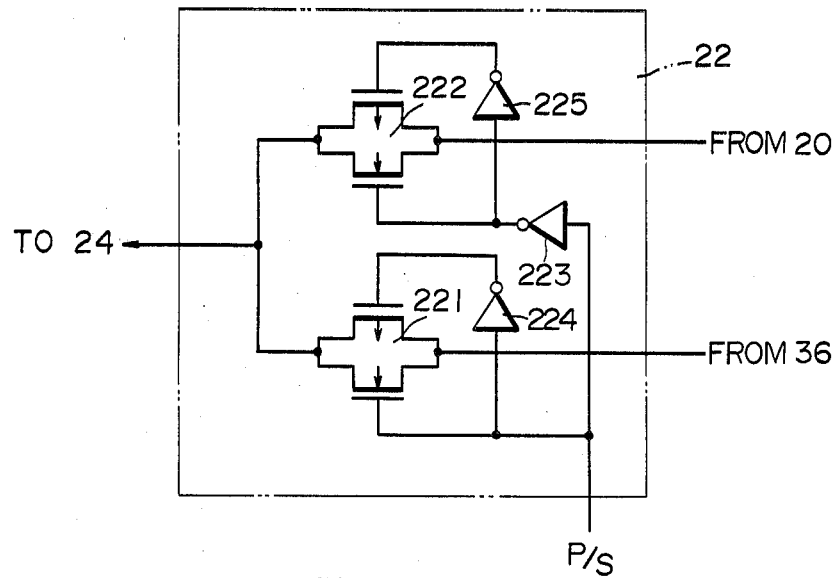
FIG. 6 is a schematic diagram showing a preferred embodiment of a switch circuit.

The digital signal obtained from the first charge pump 36 and the digital signal obtained from the second charge pump 20 both are applied to the switch circuit 22 as shown in FIG. 6. The switch circuit 22 comprises two analog gates 221 and 222. The analog gates 221 and 222 each comprise a parallel connection of complimentary MOS field effect transistors and are connected such that the analog gate 221 receives the output of the first charge pump 36 and the analog gate 222 receives the output of the second charge pump 20. The outputs of the respective analog gates 221 and 222 are commonly connected to the low-pass filter 24. The signal P/S from the P/S signal generator (FIG. 7) is applied to the switch circuit 22 as a control signal thereof. Thus, the switch circuit 22 is structured such that the signal P/S is received by means of a combination of three inverters 223, 224 and 225 so that the analog gate 221 is rendered conductive when the signal P/S is the high level and the analog gate 222 is rendered conductive when the signal P/S is the low level.

Figure 7:
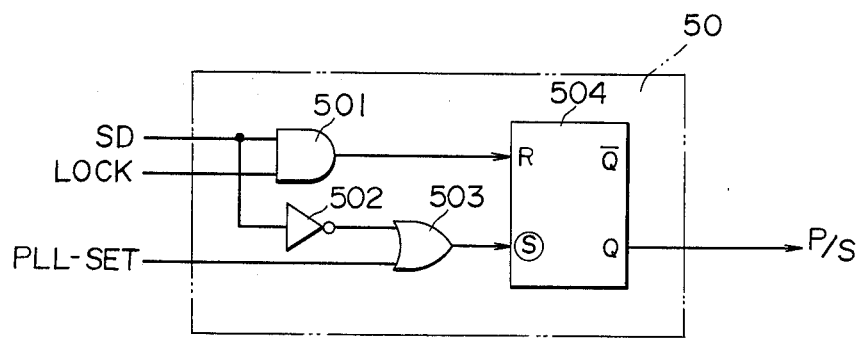
FIG. 7 is a schematic diagram showing a preferred embodiment of a P/S signal generating circuit.
Figure 8:
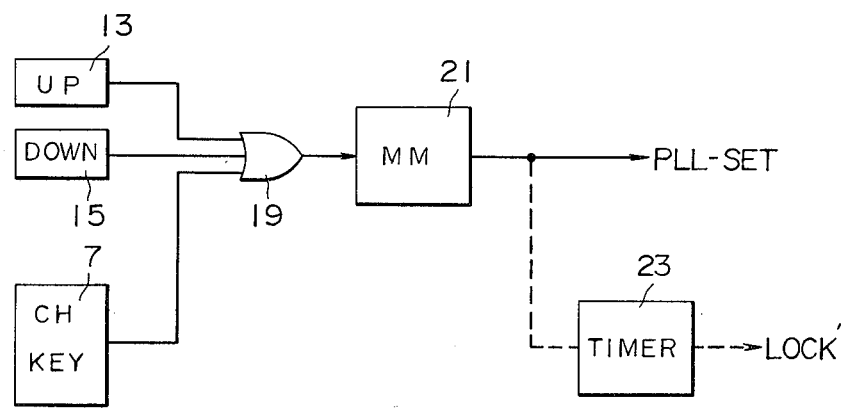
FIG. 8 is a block diagram showing a preferred embodiment of a circuit for generating a signal, PLL-SET.

FIG. 7 is a schematic diagram showing the P/S signal generator 50 included in the control circuit 11. The P/S signal generator 50 comprises a two-input AND gate 501. One input of the AND gate 501 is connected to receive the detected signal SD obtained from the tuning detecting circuit 40 and the other input is connected to receive the lock detected signal LOCK obtained from the lock detecting circuit 38. The output of the AND gate 501 is applied to the reset terminal R of a set preferential flip-flop 504. The signal SD is inverted by an inverter 502 and the inverted output is applied to one input of a two-input OR gate 503. The other input of the OR gate 503 is connected to receive the signal PLL-SET (FIG. 8) and the output of the OR gate 503 is applied to the set input S of the set preferential flip-flop 504. The signal PLL-SET is obtained from a circuit as shown in FIG. 8. More specifically, the operation signals of the channel key 7 serving as a station selecting means and of the upward key 13 and the downward key 15 are applied through an OR gate 19 to the trigger input of a monostable multivibrator 21. More specifically, the monostable multivibrator 21 is responsive to the rise of the output of the OR gate 19 to provide the signal PLL-SET which lasts for a predetermined time period. Accordingly, it should be appreciated that the signal PLL-SET assumes the high level or the logic level one when station selection is commanded by means of the station selecting means. Therefore, the P/S signal generator 50 shown in FIG. 7 operates such that when station selection is commanded by means of the keys 7, 13 or 15, the flip-flop 504 is set and the non-inverted output Q, i.e. the signal P/S changes to the high level or the logic level one. When the signals SD and LOCK are obtained thereafter, both as the high level or the logic level one, the flip-flop 504 is reset and accordingly the signal P/S turns to the low level. Thus, the P/S signal generator 50 generates the signal P/S representing whether or not the receiver 1 is in the state of receiving a desired broadcasting wave.

Figure 9:
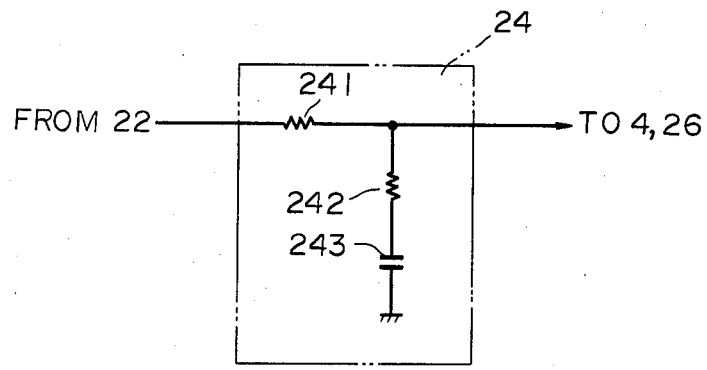
FIG. 9 is a schematic diagram showing one example of a low-pass filter.

FIG. 9 shows in detail the low-pass filter 24. The low-pass filter 24 receives the signal from the switch circuit 22, i.e. the digital signal obtained from the charge pump 36 or 20. When the digital signal is at the high level, an electrical charge storage means, i.e. a capacitor 243, is charged through resistors 241 and 242. Accordingly, the output voltage of the low-pass filter 24, i.e. the tuning voltage or the control voltage, increases. Conversely, when the digital signal is at the low level, the electrical charge in the capacitor 243 is discharged, so that the output voltage of the low-pass filter 24 decreases. When the digital signal is in the high impedance state, the capacitor 243 is neither charged nor discharged and accordingly the output voltage of the low-pass filter 24 maintains at a constant level. Now that the structural features of the embodiment have been described, the operation of the FIG. 1 embodiment will be described with reference to FIGS. 1 to 9, 10A and 10B.

Figure 10A:
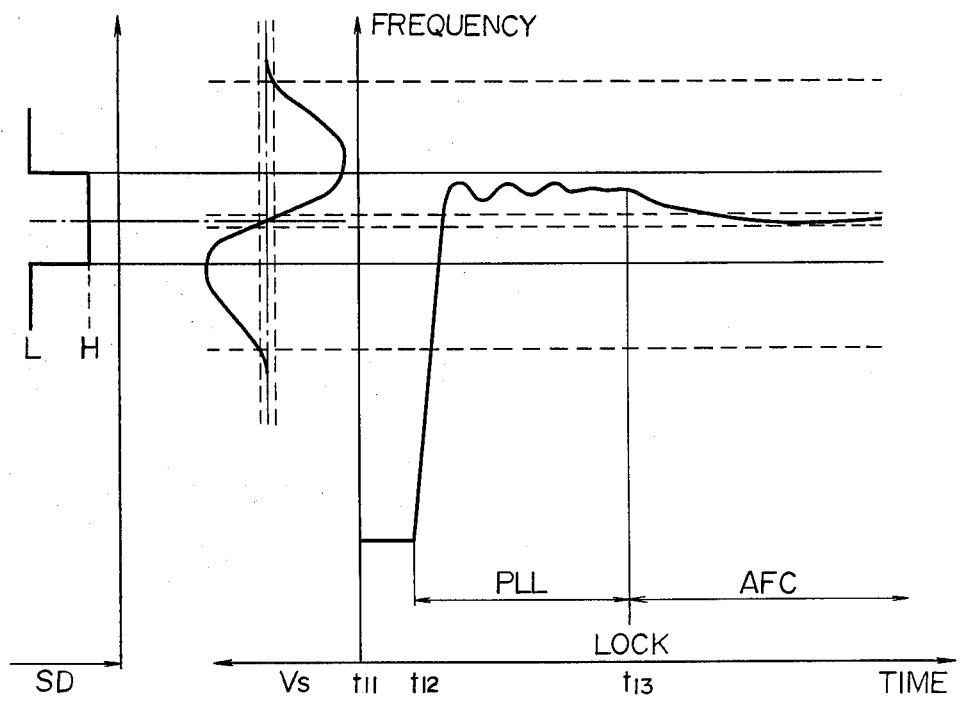
FIGS. 10A and 10B are graphs for explaining the operation of the FIG. 1 embodiment.

Referring to FIG. 10A, let it be assumed that the channel key 7 or the upward key 13 or the downward key 15 is operated at the time t11 to provide a station selecting command. Then, a muting circuit, not shown, is responsive to the station selecting command, so that the sound signal applied to the low frequency amplifier 12 is muted. On the other hand, the memory circuit 9 and/or the "N" value generator 48 are responsive to the operation of the key 7, 13 or 15 to provide the frequency division ratio data to the programmable frequency divider 30. Accordingly the frequency division ratio data associated with the desired channel (frequency) is preset in the programmable frequency divider 30. At the same time, the monostable multivibrator 21 shown in FIG. 8 is responsive to the operation of the key 7, 13 or 15 to provide the signal PLL-SET. Therefore, the flip-flop 504 of the P/S signal generator 50 shown in FIG. 7 is set and the signal P/S changes to the high level or the logic level one. Then only the analog gate 221 in the switch circuit 22 (FIG. 6) is rendered conductive while the other gate 222 is rendered non-conductive. Accordingly, the output of the first charge pump 36 is applied to the low-pass filter 24, whereby the phase locked loop is established. Therefore, the output voltage of the low-pass filter 24 increases as shown in FIG. 10A (or decreases if the new selected frequency is below the original frequency) by means of the phase comparator 32 and the first charge pump 36. More specifically, after time t12 in FIG. 10A the output of the first charge pump 36 changes to the high level and the capacitor 243 of the low-pass filter 24 (FIG. 9) is charged. Accordingly, the frequency of the voltage controlled oscillator 26 increases. As the local oscillation frequency changes, the signal SD as shown in FIG. 10A is obtained from the tuning detecting circuit 40 which receives the output voltage obtained from the intermediate frequency amplifier 8 (FIG. 1). The PLL loop 5 reaches a stabilized state at time t13 in FIG. 10A and the signal LOCK is obtained from the lock detecting circuit 38 at time t13. Accordingly, an output is obtained from the AND gate 501 of the P/S signal generator 50 shown in FIG. 7 and the flip-flop 504 is reset. Therefore, the output Q of the flip-flop 504, i.e. the signal P/S turns to the low level. Then the analog gate 221 in the switch circuit 22 (FIG. 6) is closed and only the analog gate 222 is rendered conductive. This causes the digital signal from the second charge pump 20 to be applied through the switch circuit 22 to the low-pass filter 24. More specifically, at time t13, which is the automatic frequency control loop 13 operable according to the S curve signal, is established. Since the capacitor 243 (FIG. 9) of the low-pass filter 24 has been charged by that time due to the previous operation of the phase locked loop 5, the automatic frequency control loop 3 initiates an automatic frequency control operation based on the electrical charge in the capacitor 243 at the time. Accordingly, reception of a broadcasting wave of the frequency selected by the phase locked loop 5 is maintained. Then the automatic frequency control operation is continued by means of the previously described window comparator 18 and the second charge pump 20.

Figure 10B:
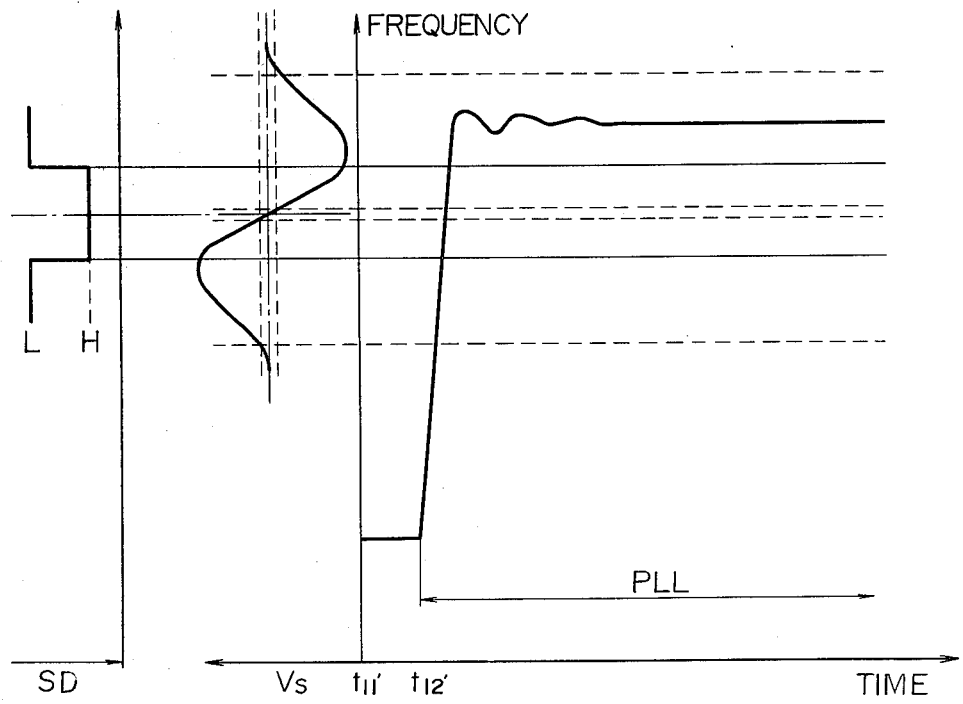

Although FIG. 10A shows a case where a broadcasting wave exists in the channel as selected, a case where no broadcasting wave exists in the channel as selected will now be described with reference to FIG. 10B. In the FIG. 10B case, the frequency division ratio data corresponding to the channel is set into the programmable frequency divider 30, like the previously described FIG. 10A case, whereby the phase locked loop 5 is established. However, since there is no broadcasting wave in the channel, no signal SD is obtained at the selected channel. Therefore, the signal P/S obtained from the P/S signal generator 50 maintains its high level and accordingly the switch circuit 22 continues to be switched to the side of the phase locked loop 5. In other words, in the FIG. 10B case, the automatic frequency control loop 3, which is operable according to the S curve signal, will not operate due to the fact that there is no broadcasting wave in the selected channel.

Now consider a case where the signal SD from the tuning detector circuit 40 has changed to the low level for some reason in the course of the tuning control by means of the automatic frequency control loop 3 as shown in FIG. 10A, such as because the electrical field intensity of the broadcasting wave has become weak, a power source voltage suddenly fluctuates and so on. In such a case, the signal SD is inverted by the inverter 502 shown in FIG. 7 to become the high level, so that the flip-flop 504 is set. Therefore, the output of the flip-flop 504, i.e. the signal P/S changes to the high level. Accordingly, the switch circuit 22 is controlled to provide the digital signal from the first charge pump 36 to the low-pass filter 24, so that again the phase locked loop 5 is established and again the tuning control operation is performed by means of the phase locked loop 5. When the signal SD changes to the high level thereafter, the tuning control operation by means of the automatic frequency control loop 3 is performed as described previously.

Figure 11:
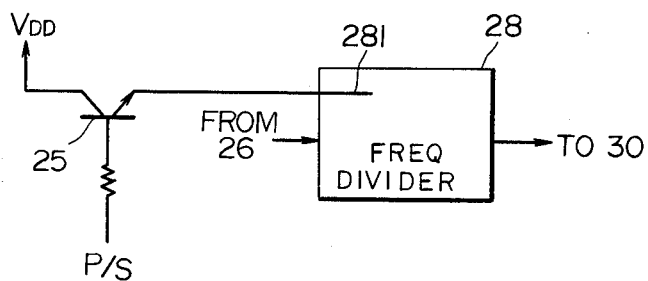
FIG. 11 is a schematic diagram showing another preferred embodiment of the present invention.

FIG. 11 is a diagram showing another embodiment of the present invention. The FIG. 11 embodiment is adapted to disable the prescaler or the fixed frequency divider 28 when the signal P/S from the P/S signal generator 50 changes to the low level, i.e. the automatic frequency control loop 3 is established. More specifically, as shown in FIG. 11, a switching transistor 25 is interposed in a voltage source line 281 and the signal P/S is applied to the base electrode of the switching transistor 25. When the signal P/S is the high level, i.e. on the occasion of station selection, the switching transistor 25 is rendered conductive. Therefore, the voltage source line 281 of the frequency divider 28 receives a voltage $V_{DD}$ through the switching transistor 25. Accordingly, when the signal P/S is at the high level, the phase locked loop 5 normally operates. Conversely, when the signal P/S turns to the low level, the switching transistor 25 is rendered non-conductive and the voltage source line 281 is interrupted. Therefore, the operation of the frequency divider 28 is stopped or disabled. The fact that the signal P/S is at the low level means that the FM receiver 1 is in a state in which it is receiving a desired broadcasting wave and accordingly in such a case the tuning control operation is performed by the automatic frequency or fine tuning control loop 3. Thus, in the case where the automatic fine tuning control loop 3 is to be operated, interference due to harmonics from the frequency divider 28 is removed by disabling the operation of this frequency divider 28 which is included in the phase locked loop 5, whereby an improved signal-to-noise ratio can be attained.

Figure 12:
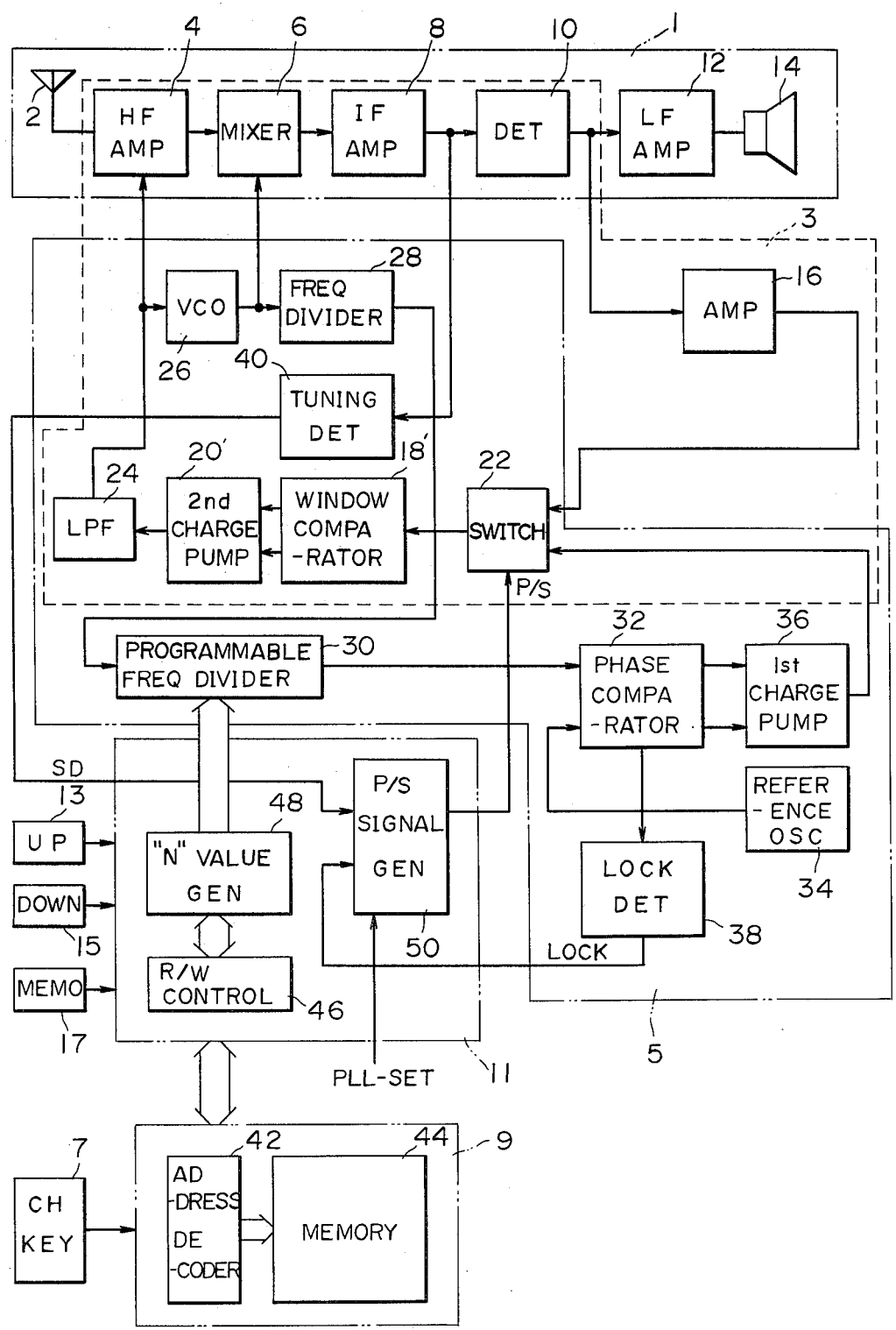
FIGS. 12 and 13 are block diagrams showing further different embodiments of the present invention, respectively.

FIG. 12 is a block diagram showing a further embodiment of the present invention. The embodiment shown is substantially the same as the FIG. 1 embodiment, except for the following respects. More specifically, the FIG. 12 embodiment is structured such that the S curve signal from the FM detector 10 including a frequency discriminator is amplified by the amplifier 16 and is applied to the switch circuit 22 as the voltage Vs and the switch circuit 22 is connected to receive the digital signal from the first charge pump 36, and the window comparator 18' and the second charge pump 20' are interposed between the switch circuit 22 and the low-pass filter 24. In the embodiment shown, the window comparator 18' and the second charge pump 20' are thus also included in the phase locked loop 5. However, in case of the FIG. 12 embodiment, the window comparator 18' and the second charge pump 20' merely function as a voltage converting means when the phase locked loop 5 is established. Accordingly, the FIG. 12 embodiment also has the effect and performs the operation of the present invention in that the tuning control operation is performed by the phase locked loop 5 during the station selection, and after the broadcasting wave is received the tuning control operation is performed by the automatic frequency control loop 3, which operable according to the S curve signal.

Figure 13:
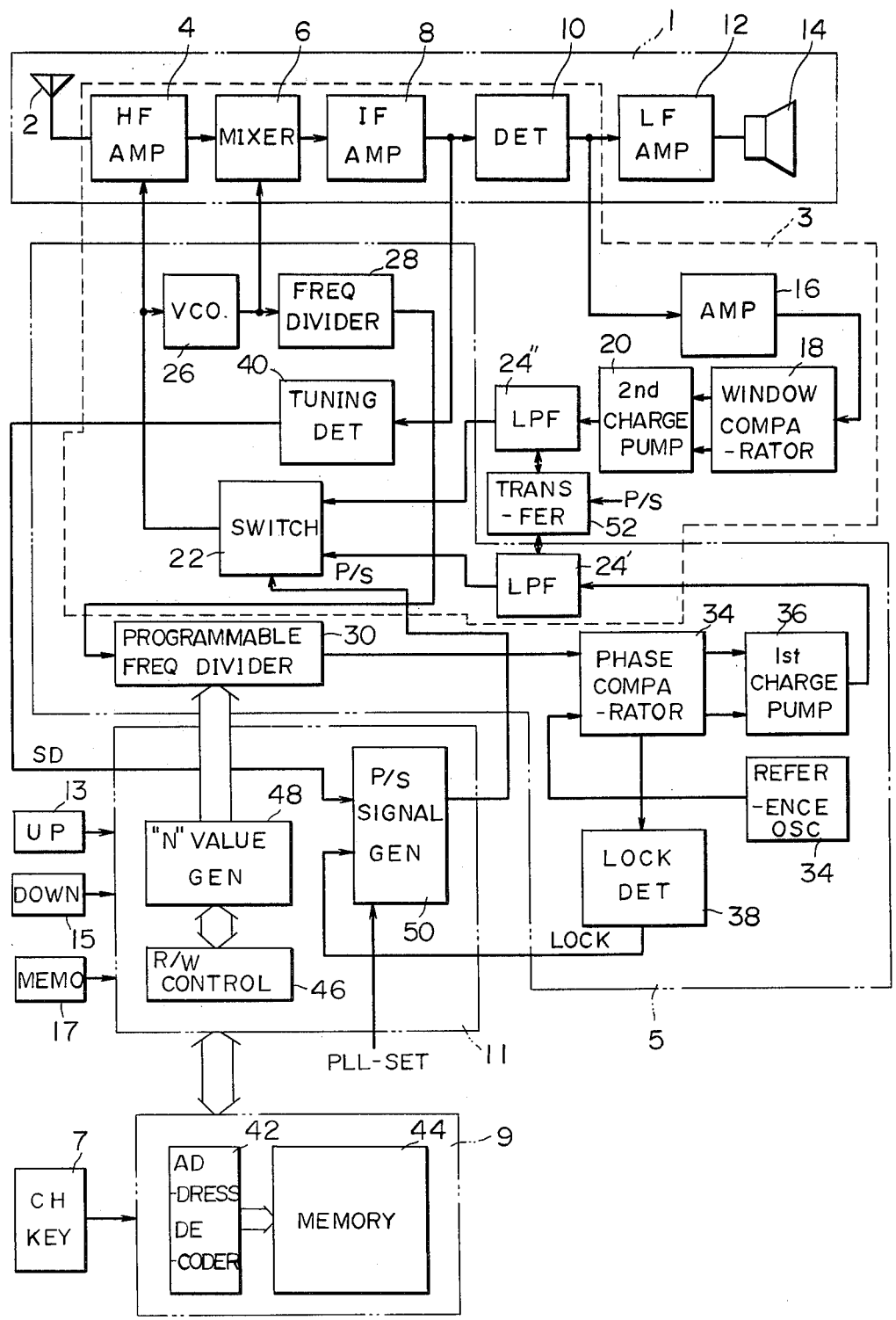

FIG. 13 is a block diagram showing a still further embodiment of the present invention. The FIG. 13 embodiment is also substantially the same as the FIG. 1 embodiment, except for the following respects. More specifically, whereas the FIG. 1 embodiment was structured to commonly use the low-pass filter 24 in both the automatic frequency control loop 3 and the phase locked loop 5, the FIG. 13 embodiment is structured such that separate low-pass filters 24' and 24" are interposed in the automatic frequency control loop 3 and the phase locked loop 5, respectively. The outputs of the low-pass filters 24' and 24" are selected by the switch circuit 22 and the selected output is applied as a tuning voltage or a control voltage to the high frequency amplifier 4 and the voltage controlled oscillator 26. In such a case, when the signal P/S turns to the low level to establish the automatic frequency control loop 3, the electrical charge stored in the capacitor of the low-pass filter 24' included in the phase locked loop 5 must be transferred to the capacitor of the low-pass filter 24' included in the automatic frequency control loop 3. To that end, a charge transfer circuit 52 is provided between the low-pass filters 24' and 24". The charge transfer circuit 52 is structured such that when the signal P/S changes to the low level an electrical charge is transferred from one low-pass filter 24' to the other low-pass filter 24". Thus, in the FIG. 13 embodiment as well, when the automatic frequency control loop 3 is established, the tuning control operation can be performed based on the tuning voltage or the control voltage obtained by the phase locked loop 5. Alternatively, the charge transfer circuit 52 may be structured such that when the signal P/S turns from the low level to the high level the electrical charge in the low-pass filter 24" is transferred to the other low-pass filter 24'.

Figure 14:
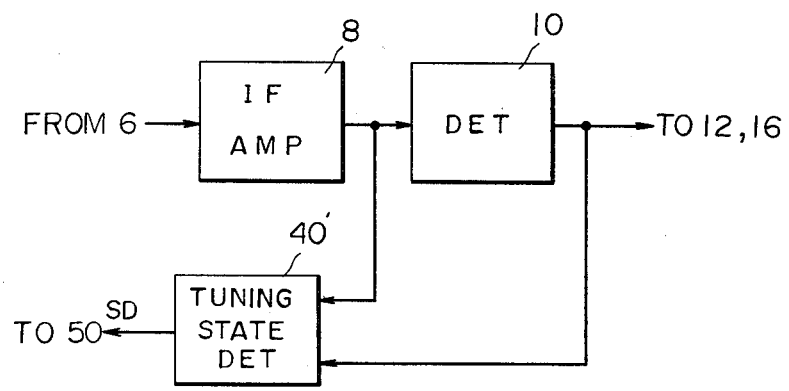
FIG. 14 is a block diagram of another example of a tuning detector circuit.
Figure 15:
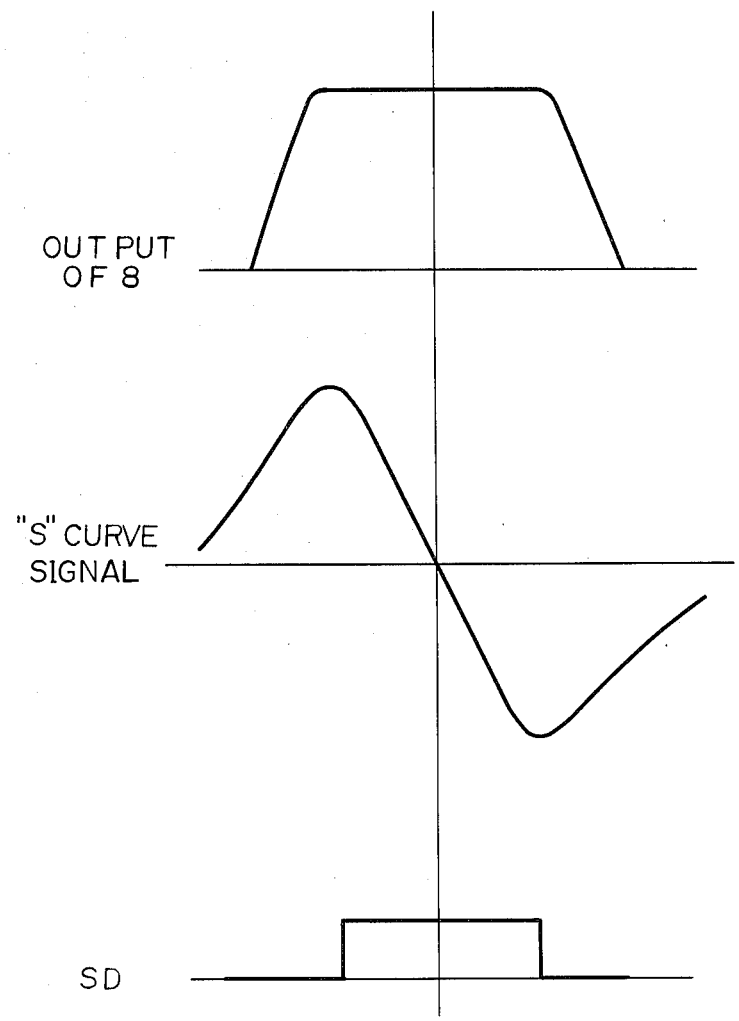
FIG. 15 is a graph for explaining the operation of the FIG. 14 embodiment.

FIG. 14 is a block diagram for depicting another example of the tuning detecting circuit. The tuning detecting circuit 40' of the FIG. 14 embodiment is connected to receive the output of the intermediate frequency amplifier 8 and the output of the FM detector 10. As shown in FIG. 15, the signal SD is generated responsive to the output of the intermediate frequency amplifier 8 and the S curve signal of the detector 10. By contrast, in the FIG. 1 embodiment, the signal SD was generated only responsive to the output of the intermediate frequency amplifier 8.

In the above described embodiments, the lock detecting circuit 38 was provided in the phase locked loop 5, so that the flip-flop 504 (FIG. 7) was reset by the detected output signal LOCK and the output signal SD of the tuning detecting circuit 40 (40'). However, the signal LOCK may be replaced by the signal LOCK' obtained from the timer 23 shown in FIG. 8. More specifically, in the previously described embodiments, the signal P/S was turned to the low level, provided that the phase locked loop 5 had reached a locked state. However, it may be considered that the phase locked loop 5 surely will reach a stabilized state after the lapse of a predetermined time period, say 0.5 second at the least, after the station selection is commanded, and based on such a consideration the lock detecting circuit 38 can be dispensed with by substituting a timer 23 of a simple structure for the lock detecting circuit 38. In such a case, when the signal SD is obtained and the signal LOCK' is also obtained from the timer 23, the flip-flop 504 (FIG. 7) is reset and the signal P/S turns to the low level.

In the foregoing the present invention was described in conjunction with several embodiments embodied in an FM receiver. However, it is pointed out that the present invention can also be applied to an AM receiver. Since the AM receiver does not comprise a frequency discriminator, in practicing the present invention in an AM receiver it becomes necessary to provide a frequency discriminator for discriminating the frequency of the intermediate frequency signal. By applying the output of such frequency discriminator to the input of the amplifier 16, for example, an automatic frequency control loop operable according to the S curve signal can be implemented in an AM receiver.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuning control apparatus of a receiver for tuning said receiver to a desired broadcasting wave, comprising:
   a tuner including a voltage controlled oscillator as a local oscillator for generating an intermediate frequency output when the receiver is tuned to the desired broadcasting wave,
   an intermediate frequency circuit for receiving the output of said tuner,
   a frequency discriminator for receiving the output of said intermediate frequency circuit,
   a phase locked loop for providing a control voltage to said voltage controlled oscillator on the occasion of a desired broadcasting wave selecting operation by said receiver such that said intermediate output frequency is obtained from said tuner, said phase lock loop including a programable frequency dividing means for dividing the voltage controlled oscillator output by a selectable ratio such that the oscillator has a preset frequency related to the desired broadcasting wave,
   an automatic frequency control loop responsive to the output of said frequency discriminator for providing a control voltage to said voltage controlled oscillator on the occasion of the reception of the desired broadcasting wave by said tuner,
   broadcasting wave sensing means responsive to the levels of both the output from said intermediate frequency circuit and an S curve signal obtained from said frequency discriminator for sensing the reception of said broadcasting wave and providing a reception signal relating thereto, and
   switching means responsive to said reception signal from said broadcasting wave sensing means for switchably selecting either said phase locked loop or said automatic frequency control loop for supply of said control voltage to said voltage controlled oscillator.

2. A tuning control apparatus of a receiver in accordance with claim 1, wherein
   said broadcasting wave sensing means is adapted to provide the reception signal with a first level on the occasion of said station selection operation and a second level different from said first level on the occasion of the reception of said broadcasting wave.

3. A tuning control apparatus of a receiver in accordance with claim 2, wherein
   said switching means is adapted to switchably select said phase locked loop responsive to said first level from said broadcasting wave sensing means and said automatic frequency control loop responsive to said second level.

4. A tuning control apparatus of a receiver in accordance with claim 1, which further comprises
   lock detecting means for detecting a locked state of said phase locked loop, and wherein
   said broadcasting wave sensing means is adapted to generate said reception signal additionally responsive to the output of said lock detecting means.

5. A tuning control apparatus of a receiver in accordance with claim 1, which further comprises
   station selection commanding means for commanding station selection to said phase locked loop, and
   timer means responsive to the output of said station selection commanding means for timing a predetermined time period, and wherein
   said broadcasting wave sensing means is adapted to generate said reception signal responsive to the output of said timer means.

6. A tuning control apparatus of a receiver in accordance with claim 1, further including a common low-pass filter located between said switching means and said voltage controlled oscillator.

7. A tuning control apparatus of a receiver in accordance with claim 1 wherein
   said automatic frequency control loop means comprises
      a window comparator for level detecting said S curve signal obtained from said frequency discriminator at two different levels and generating output signals associated therewith,
      a charge pump for receiving the output signals of said window comparator and producing a digital output, and
      a frequency loop low-pass filter responsive to the digital output of said charge pump for generating said control voltage.

8. A tuning control apparatus of a receiver in accordance with claim 7, wherein said phase locked loop, in addition to said programmable frequency dividing means, comprises:
   reference frequency signal generating means,
   phase comparing means for comparing the difference between the phases of the output of said frequency dividing means and the output of said reference frequency signal generating means,
   digital generator means for generating a digital signal responsive to the phase difference between the outputs detected by said phase comparing means, and
   phase loop low-pass filter responsive to the output of said digital generator means for generating said control voltage.

9. A tuning control apparatus of a receiver in accordance with claim 1,
   wherein said phase locked loop further comprises fixed frequency dividing means for receiving the output of said voltage controlled oscillator, frequency dividing the output of said voltage controlled oscillator at a fixed frequency division ratio and applying the output thereof to said programmable frequency dividing means, and
   further comprising disabling means responsive to said reception signal obtained from said broadcasting wave sensing means for disabling said fixed frequency dividing means.

* * * * *